United States Patent [19]
Bang

[11] Patent Number: 5,831,324
[45] Date of Patent: Nov. 3, 1998

[54] ELECTROMAGNETIC WAVE SUPPRESSION METHOD IN A SEMICONDUCTOR MANUFACTURING PROCESS

[75] Inventor: Il-soon Bang, Suwon, Rep. of Korea

[73] Assignee: SamSung Electronics Co., Ltd., Suwon, Rep. of Korea

[21] Appl. No.: 572,443

[22] Filed: Dec. 14, 1995

[30] Foreign Application Priority Data

Dec. 14, 1994 [KR] Rep. of Korea ................. 1994 34252

[51] Int. Cl.⁶ .................................................. H01L 29/06
[52] U.S. Cl. .......................................... 257/508; 257/659
[58] Field of Search .................................. 257/508, 607, 257/612, 659, 660, 913

[56] References Cited

U.S. PATENT DOCUMENTS

| | | | |
|---|---|---|---|
| 3,659,162 | 4/1972 | Toshio et al. ............................ | 257/508 |
| 4,009,484 | 2/1977 | Ogiue et al. ............................. | 257/607 |
| 4,203,780 | 5/1980 | Matsushita et al. ..................... | 257/611 |
| 4,766,482 | 8/1988 | Smeltzer et al. ........................ | 257/660 |
| 5,200,639 | 4/1993 | Ishizuka et al. ........................ | 257/659 |
| 5,416,668 | 5/1995 | Benzoni .................................. | 361/816 |
| 5,428,242 | 6/1995 | Furuya et al. ........................... | 257/538 |
| 5,428,506 | 6/1995 | Brown et al. ............................ | 361/794 |
| 5,428,508 | 6/1995 | Pronto .................................... | 361/818 |
| 5,442,521 | 8/1995 | Hirvonen et al. ....................... | 361/800 |
| 5,475,255 | 12/1995 | Joardar et al. .......................... | 257/659 |
| 5,644,157 | 7/1997 | Iida et al. ............................... | 257/508 |
| 5,665,978 | 9/1997 | Uenoyama et al. ..................... | 257/30 |

*Primary Examiner*—David B. Hardy
*Attorney, Agent, or Firm*—Robert E. Bushnell, Esq.

[57] ABSTRACT

A method for suppressing an electromagnetic wave in a semiconductor manufacturing process contemplates diffusion of a material into a region where active elements for processing a high speed digital signal are massed. During a wafer manufacturing process, high temperature particles of the material is diffused to shield the active elements of the integrated circuit from electromagnetic waves, and the integrated circuit is packaged in a circuit interlocking a wafer chip and external electrical conducting pins emanating from the integrated circuit are wrapped with a material exhibiting a resistance varying directly with the frequency of a high frequency components of electromagnetic interference. Since a main portion is surrounded by a material for shielding an electromagnetic wave in a wafer manufacturing process and a package manufacturing process for the manufactured wafer chip, electromagnetic shielding is obtained relative to other circuits on the chip. As a result, a high frequency component can be prevented from being externally radiated.

12 Claims, 5 Drawing Sheets

ELECTROMAGNETIC WAVE SUPPRESSION METHOD IN A SEMICONDUCTOR MANUFACTURING PROCESS

CROSS-REFERENCE TO RELATED APPLICATION

This application makes reference to, incorporates the same herein, and claims all benefits accruing under 35 U.S.C. §119 from an application for ELECTROMAGNETIC WAVE SUPPRESSION METHOD IN A SEMICONDUCTOR MANUFACTURING PROCESS earlier filed in the Korean Industrial Property Office on the 14th of Dec. 1995 and there assigned Ser. No 1994/34252.

BACKGROUND OF THE INVENTION

The present invention relates to apparatus and processes for suppressing electromagnetic waves during semiconductor manufacturing, and more particularly, to apparatus and process for suppressing an electromagnetic wave during semiconductor manufacturing process and which shields a region where active elements are massed and packages a wafer chip using a material shielding the electromagnetic wave in a wafer processing and a packaging process of the processed wafer chip, to thereby prevent a high frequency noise component from being externally radiated.

Nowadays, electronic and computer industries have been remarkably developed owing to rapid development in semiconductor manufacturing and digital application techniques. The development aims to miniaturize, reduce the weight, integrate and increase the speed of an electronic device. In addition, an operating frequency applied for such an electronic device becomes higher. Accordingly, an electromagnetic wave environment becomes worse, and the possibility of generating an electromagnetic interference among devices or parts becomes higher. There have been various studies on decreasing such electromagnetic wave interference and various tests on electronic devices with respect to a designated predetermined standard. Therefore, meeting an electromagnetic wave interference test standard is a prerequisite for producing all kinds of electronic devices in commercial scale.

In the meantime, if performance of an electronic device satisfies an electromagnetic wave interference (EMI) standard, an electromagnetic compatibility (EMC) is ensured. As electronic devices become mostly digital, integrated and high speed, a development in a design technique for ensuring the electromagnetic compatibility comes to the fore as a difficult problem to be solved.

In general, some components in electronic devices, for example, radio, television or computer, generate electromagnetic waves which cause interference for other parts of the electronic devices. To minimize such interference, a conductive object is generally placed between the two electronic circuit portions. The shielding structure is conventionally a wall-shaped or a box completely surrounding a certain portion and is installed in an electronic circuit portion generating an electromagnetic wave or around an electronic circuit portion that is easily affected by electromagnetic wave. A circuit designer or a system designer should design a system so that electronic parts (mainly active elements) are disposed to minimize generation of an electromagnetic wave (high frequency noise) or a pattern of a signal transmission line is disposed at a shortest distance. In addition, a system may be constructed so that an electromagnetic wave is removed by an EMI filter prior to a signal transmission in a conductor serving as an antenna for radiating the electromagnetic wave. Specifically, an input/output cable generally plays a role of the antenna in a digital device, and a predetermined circuit pattern of a PCB sometimes serves as an antenna.

Technology has advanced so that individual semiconductor integrated circuit chips block electromagnetic interference from both entering and leaving a single integrated circuit semiconductor wafer chip. This can be observed in U.S. Pat. No. 5,270,488 to Ono, U.S. Pat. No. 5,153,379 to Guzuk, and U.S. Pat. No. 5,166,772 to Soldner. In each of these cases, a conductive shield, screen, or thin film encapsulates the integrated circuit wafer chip and the connection lines, preventing electromagnetic interference from either entering or leaving.

U.S. Pat. No. 5,428,242 to Furuya discloses a semiconductor structure which contains a solid aluminum EMI shield that blocks individual semiconductor components. The shield is formed during the fabrication of the chip by depositing a metallic layer on top and patterned so that EMI entering or leaving the underlying electronic component is blocked. I have noticed that designs such as those found in Furuya '242, Guzuk '379, Soldner '772, and Ono '488 do not suggest using materials that block high frequencies more than low frequencies. Moreover, I have found that such designs rely upon a solid metal in an effort to block electromagnetic interference, ignoring the advantages of fibers and dopants to attenuate electromagnetic interference. Furthermore, I have observed that designs such as these fail to minimize electromagnetic interference from propagating between active electronic components fabricated on the same chip.

The conventional method for preventing an electromagnetic wave is mainly sought along a transmission path of an electric signal. There has previously been no method for preventing an electromagnetic wave in a semiconductor integrated circuit that causes a noise or a process for manufacturing the semiconductor integrated circuit. Accordingly, I have found that an unexpected error can be caused by the semiconductor integrated circuit due to electromagnetic wave interference creates much problem in using electronic devices.

SUMMARY OF THE INVENTION

Accordingly, it is an object of the present invention to provide an improved process and device for suppression of electromagnetic waves in an integrated circuit.

It is another object to provide a semiconductor device and manufacturing process for minimizing external radiation of high frequency components of noise components.

It is still another object to provide a semiconductor device and manufacturing process for blocking the passage of electromagnetic interference between electrical components on the same chip.

It is yet another object to provide a semiconductor device and manufacturing process for blocking electromagnetic interference from entering or radiating from the interconnect lines of an integrated circuit chip.

These and other object may be attained with a manufacturing process and a semiconductor device made by that process, by diffusing into a region where active elements for processing a high speed digital signal are massed, high temperature particles consisting of a material for shielding an electromagnetic wave in a wafer manufacturing process, and packaging a circuit interlocking a wafer chip and an external pin by wrapping a material whose resistance becomes increases with respect to a high frequency component in a process for packaging a processed wafer chip.

Since a main portion is surrounded by a material for shielding an electromagnetic wave in a semiconductor wafer manufacturing process and a package manufacturing process for the manufactured wafer chip, shielding is possible with respect to other circuits. As a result, a high frequency noise component can be prevented from being externally radiated.

BRIEF DESCRIPTION OF THE DRAWINGS

A more complete appreciation of this invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
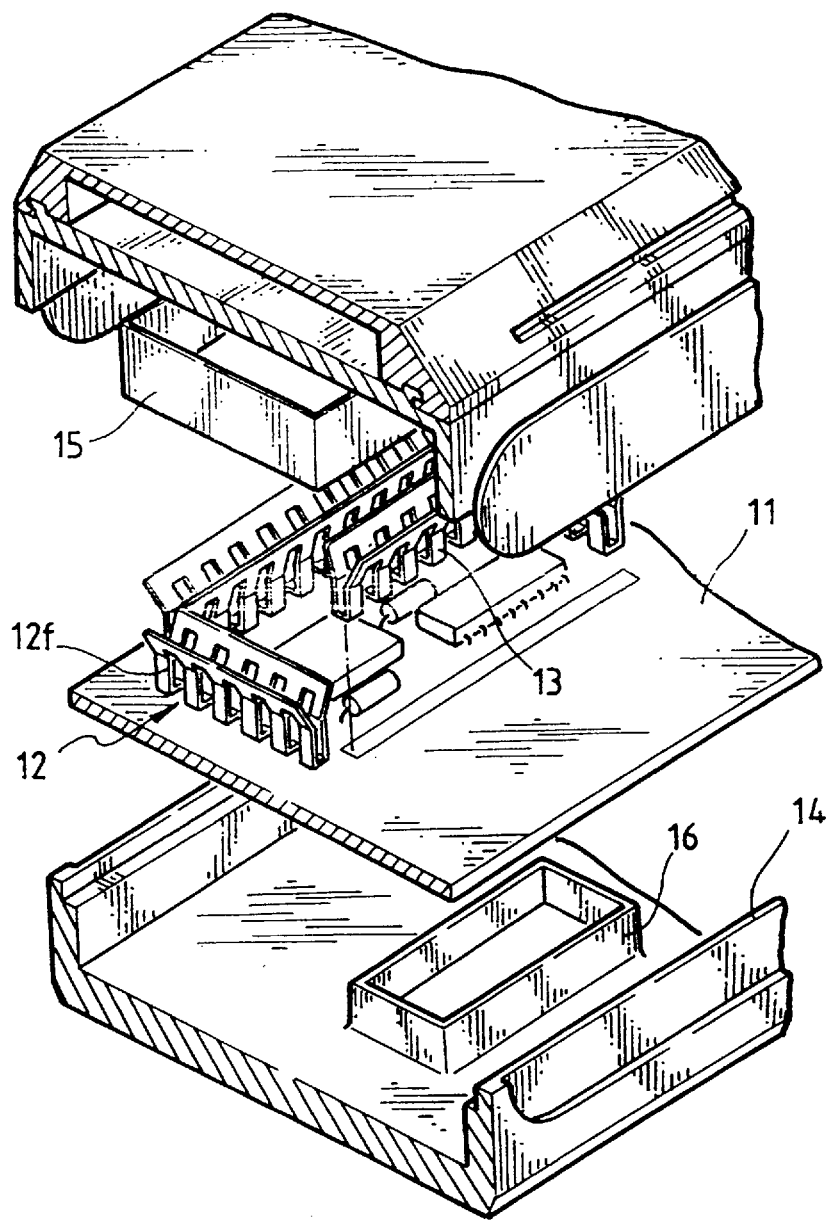
FIG. 1 is a partly extracted exploded view of a conventional portable wireless telephone provided with a shielding structure.

Turning now to the drawings, FIG. 1 shows examples of conventional methods for preventing the propagation of an electromagnetic wave. FIG. 1 is a partly extracted exploded view of a portable wireless telephone provided with a shielding structure.

In the apparatus represented by FIG. 1 which partially shows an internal structure of a wireless telephone, spring channels 12 and 13 having a plurality of spring fingers 12f are installed on circuit substrate 11 which is loaded and assembled into a housing 14. Here, a shielding structure formed of conductive materials is installed above and below circuit substrate 11. As shown in FIG. 1, a fence-type shielding structure 15 surrounding side portions of spring channels 12 and 13 is installed above circuit substrate 11, and a rectangle shielding structure 16 having four-wall surfaces of a predetermined height is installed below circuit substrate 11. An electronic circuit portion for generating an electromagnetic wave or an electronic circuit portion easily affected by an electromagnetic wave is shielded from other peripheral electronic circuit portions or circuit devices by shielding structures 15 and 16, to thereby suppress electromagnetic wave interference.

Figure 2:
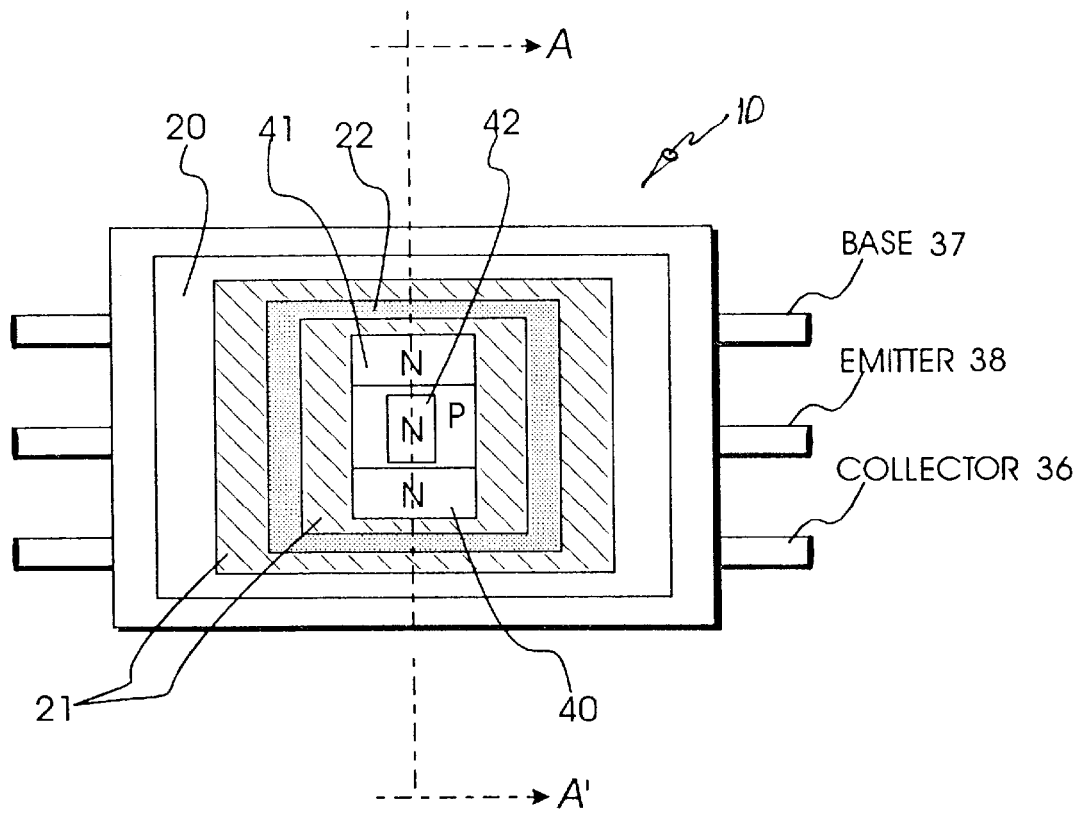
FIG. 2 is a top view of one embodiment of this invention where a single transistor device is in a package containing external pins, where the device is surrounded by a fence type EMI shield.
Figure 3:
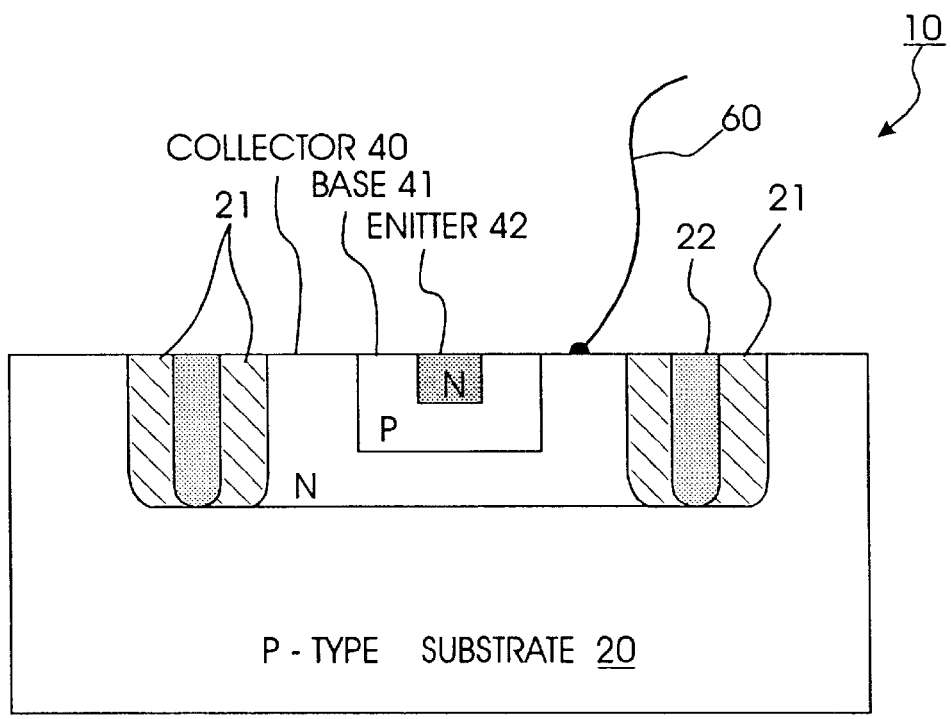
FIG. 3 is a cross sectional view taken along sectional line A–A' in FIG. 2, showing that embodiment of a semiconductor device constructed according to the principles of the present invention.

Turning now to FIGS. 2 and 3, FIG. 2 shows the top view of one embodiment of an integrated circuit chip processed according to the principles of this invention. FIG. 3 is a cross section of FIG. 2 taken along cross sectional line A–A'. In this embodiment, the chip is constructed with a single N—P—N bipolar junction transistor fabricated on a p-type conductivity substrate 20. A first conducting region 40 is formed by doping with substrate with n-type impurities. This first region 40 will become the collector of the transistor. Within 40 is a second region which is a p-type conducting region 41, whose carrier concentration far exceeds that of the substrate 20. This second region 41 will become the base of the transistor. Within the p-type conducting region 41 is a third region formed with another n-type conducting region 42 having a carrier concentration equivalent to that of collector 40. Region 42 is the emitter of the transistor. Since regions 40, 41, and 42 are all made of conducting material, they collectively form what is called the electrically active component because of its electrical conductivity and because of the fact that the resultant device is non-linear. Surrounding the first region 40 is the isolation trench 21 formed around the transistor. The isolation trench 21 extends through the conducting region 40 to the substrate 20. The trench is filled with silicon dioxide and provides electrical isolation between the device and other areas on the wafer. Within the isolation trench 21 is a fourth region 22 containing a material that blocks the propagation of electromagnetic radiation. Like isolation trench 21, fourth region 22 extends inwardly at least as far as the electrically conducting regions, 40, 41, and 42. The fourth region 22 is formed with a material that exhibits an electrical resistance that increases directly with frequency. Region 22 forms an electromagnetic shield that blocks radiation propagating along the surface of the wafer going to and from the encircled electrically active component denoted by 40, 41, and 42. A thin, electrically conducting connection line 60 (typically made of gold) connects collector 40 to an external pin 36 (not visible in the cross-sectional view of FIG. 3).

A transistor integrated circuit wafer chip is exemplified in FIGS. 2 and 3 in a region where active elements for processing a high speed digital signal are massed between silicon dioxide isolation trenches 21 and between high temperature particle regions 22 formed with a material that can shield an electromagnetic wave. A preferred material is ferrite which can be diffused into 22. Ferrite is characterized as a material whose resistance increases at a high frequency, thereby forming a fence-type electromagnetic wave shielding region 22. Thus, a high frequency noise can be prevented from being externally radiated. In an embodiment where there are many functional devices on a single chip, shield 22 would prevent electromagnetic interference created by one device from impinging upon a neighboring device on the same chip.

Figure 4:
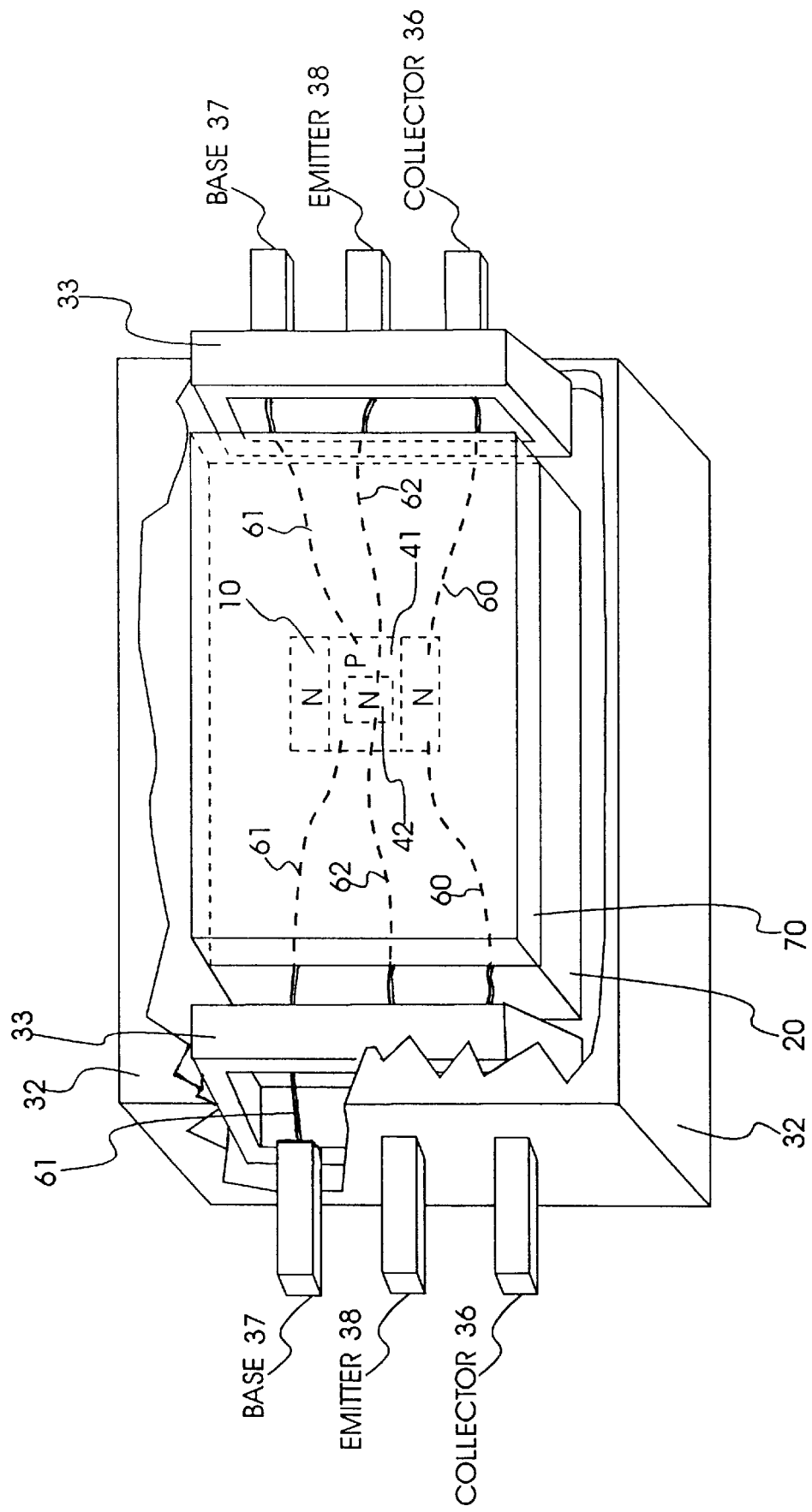
FIG. 4 is a partially exploded, perspective view for packaging a shielding region to a semiconductor wafer chip manufactured according to the principles of the present invention.

FIG. 4 illustrates a method for removing a noise in a package manufacturing process for a processed wafer chip in a method for suppressing an electromagnetic wave in a semiconductor manufacturing process of the present invention. A processed wafer substrate 20 is located on the inside the package 32 and connected to external pins 36, 37, and 38 via connection lines 60, 61, and 62. The external pins are parallel to each other and a duplicate set of three are situated on either side of the package. An encapsulation layer 70 covers the substrate 20, the electrically active component, and the connection lines 60, 61, 62. This encapsulation 70 provides electrical isolation from the package 32. Here, high speed signals transmitted via the connection lines 60, 61, and 62, can operate as an antenna, to thereby radiate high frequency components to an external space. Accordingly, as shown in FIG. 4, a ring-shaped wall shielding wall 33

(shown, for purposes of facilitating an understanding of its structure, in a partially exploded illustration as spaced-apart from substrate 20) formed by a material (for example, a ferrite) that exhibits resistance to flow of electrical current that increases directly with frequency of the high frequency components of electromagnetic interferance. In its actual disposition, shielding wall 33 abuts substrate 20. Connection lines 60, 61, and 62 extend through ring 33 to external pins 37, 38, and 39. Ring-shaped wall 33 must be tall enough to spacially accommodate through passage of these connection lines 60, 61, and 62. A ring-shaped wall 33 is used to block EMI emanating from or impinging upon the connection lines. The cross section of ring-shaped wall 33 extends above the surface of substrate 20 and above connection line 60. It is necessary for the ring-shaped wall 33 to rise above the semiconductor device 10 so that ring-shaped wall 33 may surround and accommodate passage of connection lines 60, 61, 62 and block electromagnetic interference while not interfering physically or electrically with these connection lines. The arrangement in FIG. 4 can suppress undesired high frequency noise components which are externally radiated from the connection lines 60, 61, 62.

Figure 5:
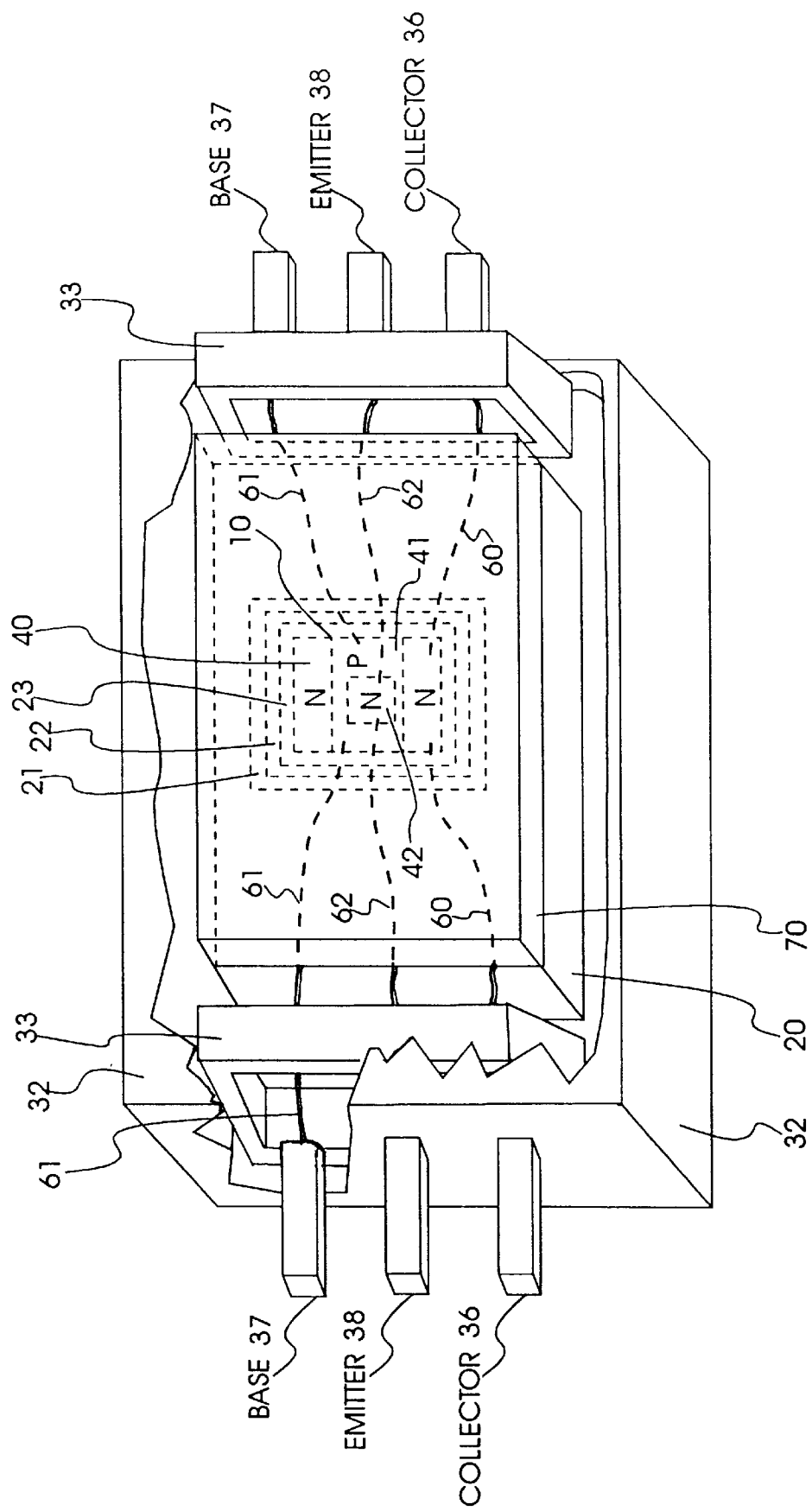
FIG. 5 is a partially exploded, perspective view of an alternative embodiment of a semiconductor device manufactured according to the principles of the present invention.

FIG. 5 shows an alternative embodiment with electrically isolating trench 21 containing a built in electromagnetic interference shield 22. The lines on the semiconductor wafer are broken and not solid because encapsulation layer 70 covers the upper surface of the semiconductor device 10. A main portion of the integrated circuit is surrounded by a material, such as ferrite, for attenuating electromagnetic interference in a wafer manufacturing process and a package manufacturing process for the manufactured wafer chip, electromagnetic shielding is provided relative to other circuits on the chip. As a result, high frequency components can be prevented from being externally radiated.

Figure 6:
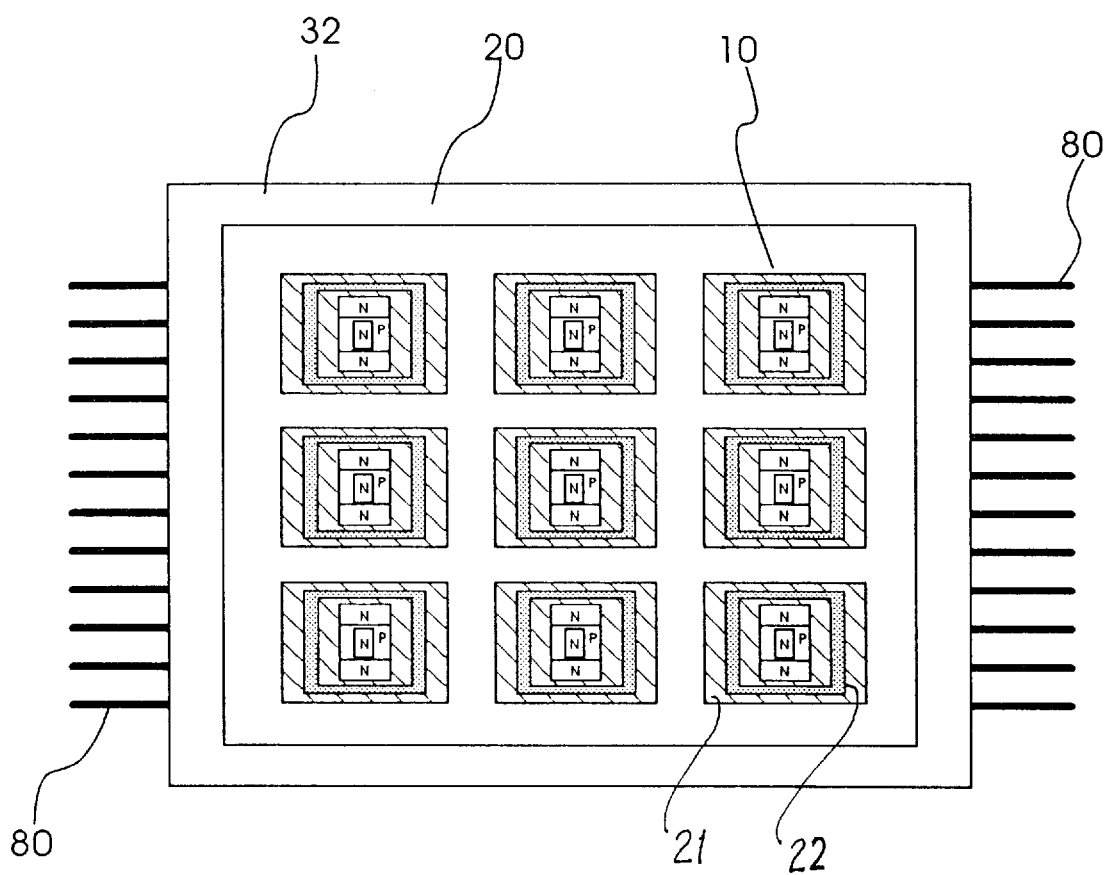
FIG. 6 is a top view of an alternative embodiment of a portion of an integrated circuit manufactured according to the principles of the present invention.

FIG. 6 illustrates a top view of an embodiment constructed with the semiconductor wafer containing an ordered array of a plurality of active devices 10, with individual electrically isolating trenches 21 containing the built-in electromagnetic interference shield to separately protect each electrically active component 10 on the chip from each other. Since a main portion is surrounded by a material such as ferrite, for shielding electromagnetic waves, electromagnetic shielding is obtained relative to active devices and other circuits on the chip. As a result, a high frequency components of electromagnetic interference can be prevented from disturbing neighboring active devices or other circuit components on the same integrated circuit chip.

As described above, a method for suppressing an electromagnetic wave in a semiconductor manufacturing process of the present invention surrounds a main portion with a material that can shield an electromagnetic wave in a wafer manufacturing process and a package manufacturing process for the manufactured wafer chip. Therefore, a shielding with respect to other circuits are possible, to thereby prevent a high frequency noise component form being externally radiated.

What is claimed is:

1. An electronic device, comprising:
a substrate of a semiconducting material exhibiting a first type electrical conductivity;
an electrically active component formed upon said substrate comprising:
a first region exhibiting a second type electrical conductivity opposite to said first type,
a second region formed within said first region and exhibiting said first type electrical conductivity but having a different magnitude, and
a third region formed within said second region and exhibiting said second type electrical conductivity;
an electrical isolation trench comprised of an electrically insulating material surrounding a periphery of said electrically active component; and
a fourth region located entirely within and separated from said first region by said electrical isolation trench, said fourth region being comprised of particles exhibiting resistance that increases with signal frequency.

2. The electronic device of claim 1, further comprising:
a plurality of electrically conductive external pins;
a plurality of connection lines electrically connecting different ones of said plurality of external pins to said integrated circuit semiconductor wafer chip; and
a ring-shaped shielding wall surrounding said plurality of connection lines, said shielding wall being comprised of a material exhibiting resistance that increases with frequency of a signal conducted through said plurality of connection lines.

3. The electronic device of claim 2, further comprising:
said ring-shaped wall comprised of:
a continuous band of said material having a rectangular shape bent into right angles at four locations forming a closed loop completely surrounding said electrically active device and said connection lines.

4. An electronic device, comprising:
a substrate of a semiconducting material exhibiting a first type of electrical conductivity;
a first region formed within said substrate having a second type of electrical conductivity opposite to said first type;
a second region formed within said first region and having said first type of electrical conductivity;
a third region formed within said second region and having said second type of electrical conductivity;
a first trench comprised of an electrically insulating material adjacent to and surrounding a periphery of said first region; and
a second trench comprised of particles having an electrical resistance that increases with signal frequency adjacent to and surrounding said first trench; and
a third trench comprised of said electrically insulating material found in said first trench, said third trench adjacent to and surrounding said second trench.

5. The electronic device of claim 4, further comprised of said third trench being surrounded by said substrate.

6. The electronic device of claim 5, further comprising:
a plurality of electrically conductive external pins;
a plurality of connection lines electrically connecting different ones of said plurality of external pins to said integrated circuit semiconductor wafer chip; and
a ring-shaped shielding wall surrounding said plurality of connection lines, said shielding wall being comprised of a material exhibiting resistance that increases with frequency of a signal conducted through said plurality of connection lines.

7. The electronic device of claim 6, further comprising:
said ring-shaped wall comprised of:
a continuous band of said material having a rectangular shape bent into right angles at four locations forming a closed loop completely surrounding said electrically active device and said connection lines.

8. The electronic device of claim 6, further comprised of a first of said plurality of connection lines is electrically connected to said first region, a second of said plurality of connection lines is electrically connected to said second region, and a third of said plurality of connection lines is electrically connected to said third region.

9. An electrical device, comprising:
- a first region of semiconducting material having a first type of electrical conductivity;
- a second region of semiconducting material surrounding said first region and having a second type of electrical conductivity opposite to said first type;
- a third region of semiconducting material surrounding said second region and having a first type of electrical conductivity;
- a first trench of electrically insulating material surrounding said third region;
- a second trench comprised of particles having an electrical resistance that increases with signal frequency adjacent to and surrounding said first trench;
- a third trench comprised of said electrically insulating material found in said first trench, said third trench adjacent to and surrounding said second trench; and
- a substrate of semiconducting material having a second type of electrical conductivity, said substrate surrounding said third trench.

10. The electronic device of claim 9, further comprising:
- a plurality of electrically conductive external pins;
- a plurality of connection lines electrically connecting different ones of said plurality of external pins to said integrated circuit semiconductor wafer chip; and
- a ring-shaped shielding wall surrounding said plurality of connection lines, said shielding wall being comprised of a material exhibiting resistance that increases with frequency of a signal conducted through said plurality of connection lines.

11. The electronic device of claim 10, further comprising:
said ring-shaped wall comprised of:
- a continuous band of said material having a rectangular shape bent into right angles at four locations forming a closed loop completely surrounding said electrically active device and said connection lines.

12. The electronic device of claim 10, wherein a first of said plurality of connection lines is electrically connected to said first region, a second of said plurality of connection lines is electrically connected to said second region, and a third of said plurality of connection lines is electrically connected to said third region.

* * * * *